United States Patent
Liken et al.

(10) Patent No.: US 8,983,135 B2
(45) Date of Patent: Mar. 17, 2015

(54) SYSTEM AND METHOD FOR CONTROLLING VEHICLE EQUIPMENT RESPONSIVE TO A MULTI-STAGE VILLAGE DETECTION

(75) Inventors: Peter A. Liken, West Olive, MI (US); David M. Falb, Grand Rapids, MI (US); Jeremy A. Schut, Grand Rapids, MI (US); Phillip R. Pierce, Grand Rapids, MI (US)

(73) Assignee: Gentex Corporation, Zeeland, MI (US)

( * ) Notice: Subject to any disclaimer, the term of this patent is extended or adjusted under 35 U.S.C. 154(b) by 285 days.

(21) Appl. No.: 13/486,636

(22) Filed: Jun. 1, 2012

(65) Prior Publication Data
US 2013/0320193 A1 Dec. 5, 2013

(51) Int. Cl.
*H01L 27/146* (2006.01)
*B60Q 1/14* (2006.01)

(52) U.S. Cl.
CPC .............. *H01L 27/146* (2013.01); *B60Q 1/143* (2013.01); *B60Q 2300/21* (2013.01); *B60Q 2300/314* (2013.01); *B60Q 2300/3321* (2013.01)
USPC ............. 382/104; 315/159; 315/82; 348/113; 382/155

(58) Field of Classification Search
None
See application file for complete search history.

(56) References Cited

U.S. PATENT DOCUMENTS

| | | |
|---|---|---|
| 2,131,888 A | 10/1938 | Harris |
| 2,632,040 A | 3/1953 | Rabinow |
| 2,827,594 A | 3/1958 | Rabinow |
| 3,179,845 A | 4/1965 | Kulwiec |
| 3,581,276 A | 5/1971 | Newman |
| 3,663,819 A | 5/1972 | Hicks et al. |
| 4,139,801 A | 2/1979 | Linares |
| 4,151,526 A | 4/1979 | Hinachi et al. |
| 4,236,099 A | 11/1980 | Rosenblum |
| 4,258,979 A | 3/1981 | Mahin |
| 4,286,308 A | 8/1981 | Wolff |

(Continued)

FOREIGN PATENT DOCUMENTS

| | | |
|---|---|---|
| DE | 2946561 | 5/1981 |
| FR | 2641237 | 7/1990 |

(Continued)

OTHER PUBLICATIONS

JP Abstract of Patent No. 60-015237,"Headlight Device" (Jan. 25, 1985).

(Continued)

*Primary Examiner* — Tsung-Yin Tsai
(74) *Attorney, Agent, or Firm* — Price Heneveld LLP; Scott P. Ryan

(57) ABSTRACT

A system for controlling equipment of a vehicle is provided. The system is configured to image a scene external and forward of the controlled vehicle and to generate image data corresponding to acquired images including a controller for receiving and analyzing the image data and for generating a control signal in response to analysis of the image data and in response to a selected mode of operation. The controller analyzes the data in order to detect at least one characteristic in the image data and selects a mode of operation from at least one of the following modes of operation: the controller selects a dark village mode if at least one characteristic reaches a first threshold, a bright village mode if at least one characteristic reaches a second threshold, and a non-village mode if the controller is not operating in either the dark village mode or the bright village mode.

28 Claims, 8 Drawing Sheets

(56) References Cited

U.S. PATENT DOCUMENTS

| | | |
|---|---|---|
| 4,357,558 A | 11/1982 | Massoni et al. |
| 4,376,909 A | 3/1983 | Tagami et al. |
| 4,479,173 A | 10/1984 | Rumpakis |
| 4,599,544 A | 7/1986 | Martin |
| 4,645,975 A | 2/1987 | Meitzler et al. |
| 4,665,321 A | 5/1987 | Chang et al. |
| 4,692,798 A | 9/1987 | Seko et al. |
| 4,716,298 A | 12/1987 | Etoh |
| 4,727,290 A | 2/1988 | Smith et al. |
| 4,768,135 A | 8/1988 | Kretschmer et al. |
| 4,862,037 A | 8/1989 | Farber et al. |
| 4,891,559 A | 1/1990 | Matsumoto et al. |
| 4,930,742 A | 6/1990 | Schofield et al. |
| 4,934,273 A | 6/1990 | Endriz |
| 4,967,319 A | 10/1990 | Seko |
| 5,008,946 A | 4/1991 | Ando |
| 5,036,437 A | 7/1991 | Macks |
| 5,072,154 A | 12/1991 | Chen |
| 5,086,253 A | 2/1992 | Lawler |
| 5,096,287 A | 3/1992 | Kakinami et al. |
| 5,124,549 A | 6/1992 | Michaels et al. |
| 5,166,681 A | 11/1992 | Bottesch et al. |
| 5,182,502 A * | 1/1993 | Slotkowski et al. .......... 315/159 |
| 5,187,383 A | 2/1993 | Taccetta et al. |
| 5,235,178 A | 8/1993 | Hegyi |
| 5,329,206 A * | 7/1994 | Slotkowski et al. .......... 315/159 |
| 5,347,261 A | 9/1994 | Adell |
| 5,347,459 A | 9/1994 | Greenspan et al. |
| 5,355,146 A | 10/1994 | Chiu et al. |
| 5,379,104 A | 1/1995 | Takao |
| 5,396,054 A | 3/1995 | Krichever et al. |
| 5,402,170 A | 3/1995 | Parulski et al. |
| 5,416,318 A | 5/1995 | Hegyi |
| 5,426,294 A | 6/1995 | Kobayashi et al. |
| 5,428,464 A | 6/1995 | Silverbrook |
| 5,430,450 A | 7/1995 | Holmes |
| 5,434,407 A | 7/1995 | Bauer et al. |
| 5,451,822 A | 9/1995 | Bechtel et al. |
| 5,452,004 A | 9/1995 | Roberts |
| 5,471,515 A | 11/1995 | Fossum et al. |
| 5,475,441 A | 12/1995 | Parulski et al. |
| 5,481,268 A | 1/1996 | Higgins |
| 5,483,346 A | 1/1996 | Butzer |
| 5,485,155 A | 1/1996 | Hibino |
| 5,508,592 A | 4/1996 | Lapatovich et al. |
| 5,537,003 A | 7/1996 | Bechtel et al. |
| 5,541,724 A | 7/1996 | Hoashi |
| 5,550,677 A | 8/1996 | Schofield et al. |
| 5,554,912 A | 9/1996 | Thayer et al. |
| 5,574,463 A | 11/1996 | Shirai et al. |
| 5,587,929 A | 12/1996 | League et al. |
| 5,592,146 A | 1/1997 | Kover, Jr. |
| 5,614,788 A | 3/1997 | Mullins et al. |
| 5,621,460 A | 4/1997 | Hatlestad et al. |
| 5,660,454 A | 8/1997 | Mori et al. |
| 5,666,028 A | 9/1997 | Bechtel et al. |
| 5,684,473 A | 11/1997 | Hibino et al. |
| 5,707,129 A | 1/1998 | Kobayashi |
| 5,710,565 A | 1/1998 | Shirai et al. |
| 5,714,751 A | 2/1998 | Chen |
| 5,715,093 A | 2/1998 | Schierbeek et al. |
| 5,736,816 A | 4/1998 | Strenke et al. |
| 5,751,832 A | 5/1998 | Panter et al. |
| 5,781,105 A | 7/1998 | Bitar et al. |
| 5,786,787 A | 7/1998 | Eriksson et al. |
| 5,796,094 A | 8/1998 | Schofield et al. |
| 5,798,727 A | 8/1998 | Shirai et al. |
| 5,811,888 A | 9/1998 | Hsieh |
| 5,812,321 A | 9/1998 | Schierbeek et al. |
| 5,835,613 A | 11/1998 | Breed et al. |
| 5,837,994 A | 11/1998 | Stam et al. |
| 5,841,126 A | 11/1998 | Fossum et al. |
| 5,845,000 A | 12/1998 | Breed et al. |
| 5,867,214 A | 2/1999 | Anderson et al. |
| 5,877,897 A | 3/1999 | Schofield et al. |
| 5,905,457 A | 5/1999 | Rashid |
| 5,912,534 A | 6/1999 | Benedict |
| 5,923,027 A | 7/1999 | Stam et al. |
| 5,942,853 A | 8/1999 | Piscart |
| 5,990,469 A | 11/1999 | Bechtel et al. |
| 6,008,486 A | 12/1999 | Stam et al. |
| 6,018,308 A | 1/2000 | Shirai |
| 6,049,171 A | 4/2000 | Stam et al. |
| 6,097,023 A | 8/2000 | Schofield et al. |
| 6,102,546 A | 8/2000 | Carter |
| 6,130,421 A | 10/2000 | Bechtel et al. |
| 6,130,448 A | 10/2000 | Bauer et al. |
| 6,140,933 A | 10/2000 | Bugno et al. |
| 6,144,158 A | 11/2000 | Beam |
| 6,166,698 A | 12/2000 | Turnbull et al. |
| 6,184,781 B1 | 2/2001 | Ramakesavan |
| 6,255,639 B1 | 7/2001 | Stam et al. |
| 6,281,632 B1 * | 8/2001 | Stam et al. ...................... 315/82 |
| 6,329,925 B1 | 12/2001 | Skiver et al. |
| 6,349,782 B1 | 2/2002 | Sekiya et al. |
| 6,356,376 B1 | 3/2002 | Tonar et al. |
| 6,379,013 B1 | 4/2002 | Bechtel et al. |
| 6,396,040 B1 | 5/2002 | Hill |
| 6,396,397 B1 | 5/2002 | Bos et al. |
| 6,403,942 B1 | 6/2002 | Stam |
| 6,429,594 B1 * | 8/2002 | Stam et al. ...................... 315/82 |
| 6,442,465 B2 | 8/2002 | Breed et al. |
| 6,443,602 B1 | 9/2002 | Tanabe et al. |
| 6,465,962 B1 | 10/2002 | Fu et al. |
| 6,469,739 B1 | 10/2002 | Bechtel et al. |
| 6,483,438 B2 | 11/2002 | DeLine et al. |
| 6,491,416 B1 | 12/2002 | Strazzanti |
| 6,507,779 B2 | 1/2003 | Breed et al. |
| 6,550,943 B2 | 4/2003 | Strazzanti |
| 6,553,130 B1 | 4/2003 | Lemelson et al. |
| 6,558,026 B2 | 5/2003 | Strazzanti |
| 6,559,435 B2 * | 5/2003 | Schofield et al. ........... 250/208.1 |
| 6,587,573 B1 | 7/2003 | Stam et al. |
| 6,593,698 B2 * | 7/2003 | Stam et al. ...................... 315/82 |
| 6,611,610 B1 | 8/2003 | Stam et al. |
| 6,617,564 B2 | 9/2003 | Ockerse et al. |
| 6,631,316 B2 | 10/2003 | Stam et al. |
| 6,677,986 B1 | 1/2004 | Pochmuller |
| 6,728,393 B2 * | 4/2004 | Stam et al. ...................... 382/104 |
| 6,772,057 B2 | 8/2004 | Breed et al. |
| 6,774,988 B2 | 8/2004 | Stam et al. |
| 6,861,809 B2 * | 3/2005 | Stam ............................... 315/82 |
| 6,902,307 B2 | 6/2005 | Strazzanti |
| 6,913,375 B2 | 7/2005 | Strazzanti |
| 6,928,180 B2 * | 8/2005 | Stam et al. ...................... 382/104 |
| 6,946,978 B2 | 9/2005 | Schofield |
| 7,012,543 B2 | 3/2006 | Deline et al. |
| 7,038,577 B2 | 5/2006 | Pawlicki et al. |
| 7,255,465 B2 | 8/2007 | Deline et al. |
| 7,262,406 B2 | 8/2007 | Heslin et al. |
| 7,265,342 B2 | 9/2007 | Heslin et al. |
| 7,311,428 B2 | 12/2007 | Deline et al. |
| 7,321,112 B2 | 1/2008 | Stam et al. |
| 7,417,221 B2 | 8/2008 | Creswick et al. |
| 7,446,650 B2 | 11/2008 | Scholfield et al. |
| 7,467,883 B2 | 12/2008 | Deline et al. |
| 7,468,651 B2 | 12/2008 | Deline et al. |
| 7,533,998 B2 | 5/2009 | Schofield et al. |
| 7,565,006 B2 * | 7/2009 | Stam et al. ...................... 382/155 |
| 7,567,291 B2 | 7/2009 | Bechtel et al. |
| 7,653,215 B2 | 1/2010 | Stam |
| 7,658,521 B2 | 2/2010 | Deline et al. |
| 7,683,326 B2 | 3/2010 | Stam et al. |
| 7,719,408 B2 | 5/2010 | Deward et al. |
| 7,720,580 B2 | 5/2010 | Higgins-Luthman |
| 7,815,326 B2 | 10/2010 | Blank et al. |
| 7,877,175 B2 | 1/2011 | Higgins-Luthman |
| 7,881,839 B2 | 2/2011 | Stam et al. |
| 7,888,629 B2 | 2/2011 | Heslin et al. |
| 7,914,188 B2 | 3/2011 | DeLine et al. |
| 7,972,045 B2 | 7/2011 | Schofield |
| 7,994,471 B2 | 8/2011 | Heslin et al. |
| 8,045,760 B2 * | 10/2011 | Stam et al. ...................... 382/104 |
| 8,063,753 B2 | 11/2011 | Deline et al. |

(56) References Cited

U.S. PATENT DOCUMENTS

| | | | |
|---|---|---|---|
| 8,090,153 B2 | 1/2012 | Schofield et al. | |
| 8,100,568 B2 | 1/2012 | Deline et al. | |
| 8,116,929 B2 | 2/2012 | Higgins-Luthman | |
| 8,120,652 B2 * | 2/2012 | Bechtel et al. | 348/113 |
| 8,142,059 B2 | 3/2012 | Higgins-Luthman et al. | |
| 8,162,518 B2 | 4/2012 | Schofield | |
| 8,203,443 B2 | 6/2012 | Bos et al. | |
| 8,217,830 B2 | 7/2012 | Lynam | |
| 8,222,588 B2 | 7/2012 | Schofield et al. | |
| 8,258,433 B2 | 9/2012 | Byers et al. | |
| 8,325,028 B2 | 12/2012 | Schofield et al. | |
| 2002/0040962 A1 | 4/2002 | Schofield et al. | |
| 2003/0202357 A1 | 10/2003 | Strazzanti | |
| 2004/0145905 A1 | 7/2004 | Strazzanti | |
| 2008/0294315 A1 | 11/2008 | Breed | |

FOREIGN PATENT DOCUMENTS

| | | |
|---|---|---|
| FR | 2726144 | 4/1996 |
| GB | 2313973 | 12/1997 |
| JP | 5744541 | 3/1982 |
| JP | 6015237 | 1/1985 |
| JP | 62131837 | 6/1987 |
| JP | 01233129 | 9/1989 |
| JP | 5139203 | 6/1993 |
| JP | 5342901 | 12/1993 |
| JP | 06151067 | 5/1994 |
| JP | 06267304 | 9/1994 |
| JP | 6276524 | 9/1994 |
| JP | 6295601 | 10/1994 |
| JP | 6321007 | 11/1994 |
| JP | 732936 | 2/1995 |
| JP | 747878 | 2/1995 |
| JP | 7052706 | 2/1995 |
| JP | 769125 | 3/1995 |
| JP | 8166221 | 6/1996 |
| JP | 08221700 | 8/1996 |
| WO | 8605147 | 9/1986 |
| WO | 9735743 | 10/1997 |
| WO | 9843850 | 10/1998 |
| WO | 9947396 | 10/1999 |
| WO | 0022881 | 4/2000 |

OTHER PUBLICATIONS

JP Abstract of Patent No. 01233129 A, "Optical Axis Changing Device for Illuminating Lamp," (Sep. 19, 1989).
Christopher M. Kormanyos, "SAE Paper No. 980003 entitled "HID System with Adaptive Vertical Aim Control"," p. 13-18.
J.P. Lowenau et al, "SAE Paper No. 980007 entitled "Adaptive Light Control—A New Light Concept Controlled by Vehicle Dynamics and Navigation"," p. 33-38.
Franz-Josef Kalze., "SAE Paper No. 980005 entitled "Xenon Light for Main and Dipped Beam"," p. 23-26.
Tohru Shimizu et al., (SAE Paper No. 980322 entitled "Development of PWM DRL with Low RF Emissions and Low Heat," p. 113-117.
JP Abstract of Patent No. 5342901, "Projection Headlamp for Vehicles," p. 1.
JP Abstract of Patent No. 6321007, "Vehicular Dazzle Sensor," p. 1.
JP Abstract of Patent No. 08221700 A, "Stop Lamp Recognition Device," p. 1.
International Searching Authority, Patent Cooperation Treaty, International Search Report and Written Opinion, Sep. 12, 2013, 6 pages.

* cited by examiner

SYSTEM AND METHOD FOR CONTROLLING VEHICLE EQUIPMENT RESPONSIVE TO A MULTI-STAGE VILLAGE DETECTION

FIELD OF THE INVENTION

The present invention generally relates to a vehicle control system for automatic control of various vehicle equipment systems. The present invention provides a vehicle control system with improved features to detect lighting environments and automatic response to detected lighting environments.

SUMMARY OF THE INVENTION

According to one aspect of the present invention, a system is provided for controlling equipment of a controlled vehicle. The system includes an imaging system and a controller. The imaging system is configured to image a scene external and forward of the controlled vehicle and to generate image data corresponding to the acquired images. The controller is configured to receive and analyze the image data and to generate a control signal that is used to control the equipment. The control signal is generated in response to analysis of the image data and mode of operation. The controller is also configured to analyze the image data to detect at least one characteristic in the image data. In addition, the controller is configured to select a mode of operation from at least one of a dark village mode, a bright village mode, and at least one non-village mode. The controller is further configured to select a dark village mode if the characteristic reaches a first threshold. The controller is further configured to select a bright village mode if the characteristic reaches a second threshold. The controller is further configured to select one of the non-village modes if the conditions for selecting the dark village mode or the bright village mode are not met.

The characteristic of the image data may include at least one of an Average Ambient Light Level, a number of light level peaks, and a number/density of AC powered light sources in the external scene. The controller selects a dark village mode if at least one of these conditions is met: the Average Ambient Light Level of a portion of the external scene reaches a first ambient threshold level, the number of light level peaks detected in the upper portion of the external scene reaches a first peak threshold, and the number/density of AC powered light sources in at least a portion of the external scene reaches a first AC powered light source threshold. The controller selects a bright village mode if at least one of these conditions is met: the Average Ambient Light Level of a portion of the external scene reaches a second ambient threshold level, the number of light level peaks detected in the upper portion of the external scene reaches a second peak threshold, and the number/density of AC powered light sources in at least a portion of the external scene reaches a second AC powered light source threshold.

According to another aspect of the present invention, a method is provided for controlling equipment of a controlled vehicle. The method includes the steps of imaging a scene external and forward of the controlled vehicle and generating image data corresponding to the acquired images. Image data is received and analyzed in a controller to detect at least one characteristic of the image data. A control signal is generated and used to control the equipment in response to analysis of the image data and in response to a selected mode of operation. A mode of operation is selected from at least the following modes of operation: a dark village mode; a bright village mode; and at least one non-village mode. The dark village mode is selected if the characteristic reaches a first threshold. A bright village mode is selected if the characteristic reaches a second threshold, and one non-village mode is selected if either the dark village mode or the bright village mode is not selected.

According to another aspect of the present invention, a non-transitory computer readable medium is provided for controlling equipment of a controlled vehicle. The non-transitory computer readable medium has stored thereon software instructions that, when executed by a processor, cause the processor to control equipment of a controlled vehicle. The non-transitory computer readable medium executes software instructions that cause the processor to image a scene external and forward of the controlled vehicle and generates image data corresponding to the acquired images. The non-transitory computer readable medium also executes software instructions causing the processor to receive and analyze the image data to detect at least one characteristic of the image data and to generate a control signal that is used to control the equipment in response to analysis of the image data and in response to a selected mode of operation. The non-transitory computer readable medium also executes software instructions causing the processor to select a mode of operation from at least the following modes of operation: a dark village mode; a bright village mode; and at least one non-village mode. A dark village mode is selected if the characteristic reaches a first threshold, a bright village mode is selected if the characteristic reaches a second threshold, and at least one non-village mode is selected if either the dark village mode or the bright village mode is not selected.

According to another embodiment of the invention, an exterior light control is provided for controlling exterior lights of a controlled vehicle. The exterior light control includes an imaging system configured to image a scene external and forward of the controlled vehicle and to generate image data corresponding to the acquired images and a controller configured to receive and analyze the image data. The controller also configured to generate an exterior light control signal that is used to control the exterior lights in response to analysis of the image data and in response to a selected mode of operation, such that the controller may respond to analysis of image data differently when in different modes of operation. The controller is configured to analyze the image data to detect at least one of: an Average Ambient Light Level of at least a portion of the external scene; a number of light level peaks detected in an upper portion of the external scene; and a number/density of AC powered light sources in at least a portion of the external scene. The controller is further configured to select a mode of operation from at least the following modes of operation: a dark village mode; a bright village mode; and at least one non-village mode. The controller is further configured to select a dark village mode if at least one of the following conditions is met: the Average Ambient Light Level of at least a portion of the external scene reaches a first ambient threshold level; the number of light level peaks detected in the upper portion of the external scene reaches a first peak threshold; and the number/density of AC powered light sources in at least a portion of the external scene reaches a first AC powered light source threshold. The controller is further configured to select a bright village mode if at least one of the following conditions is met: the Average Ambient Light Level of at least a portion of the external scene reaches a second ambient threshold level; the number of light level peaks detected in the upper portion of the external scene reaches a second peak threshold; and the number/density of AC powered light sources in at least a portion of the external scene reaches a second AC powered light source threshold. The controller is further configured to select one of the at least one non-village modes if the controller is not operating in either the dark village mode or the bright village mode. When the controller selects a dark village mode, the exterior lights are in a first state and when the controller selects a bright village mode, the exterior lights are in a second state.

These and other features, advantages, and objects of the present invention will be further understood and appreciated by those skilled in the art by reference to the following specification, claims, and appended drawings.

BRIEF DESCRIPTION OF THE DRAWINGS

The present invention will be become more fully understood from the detailed description and the accompanying drawings, wherein.

DETAILED DESCRIPTION OF THE PREFERRED EMBODIMENTS

Figure 1:
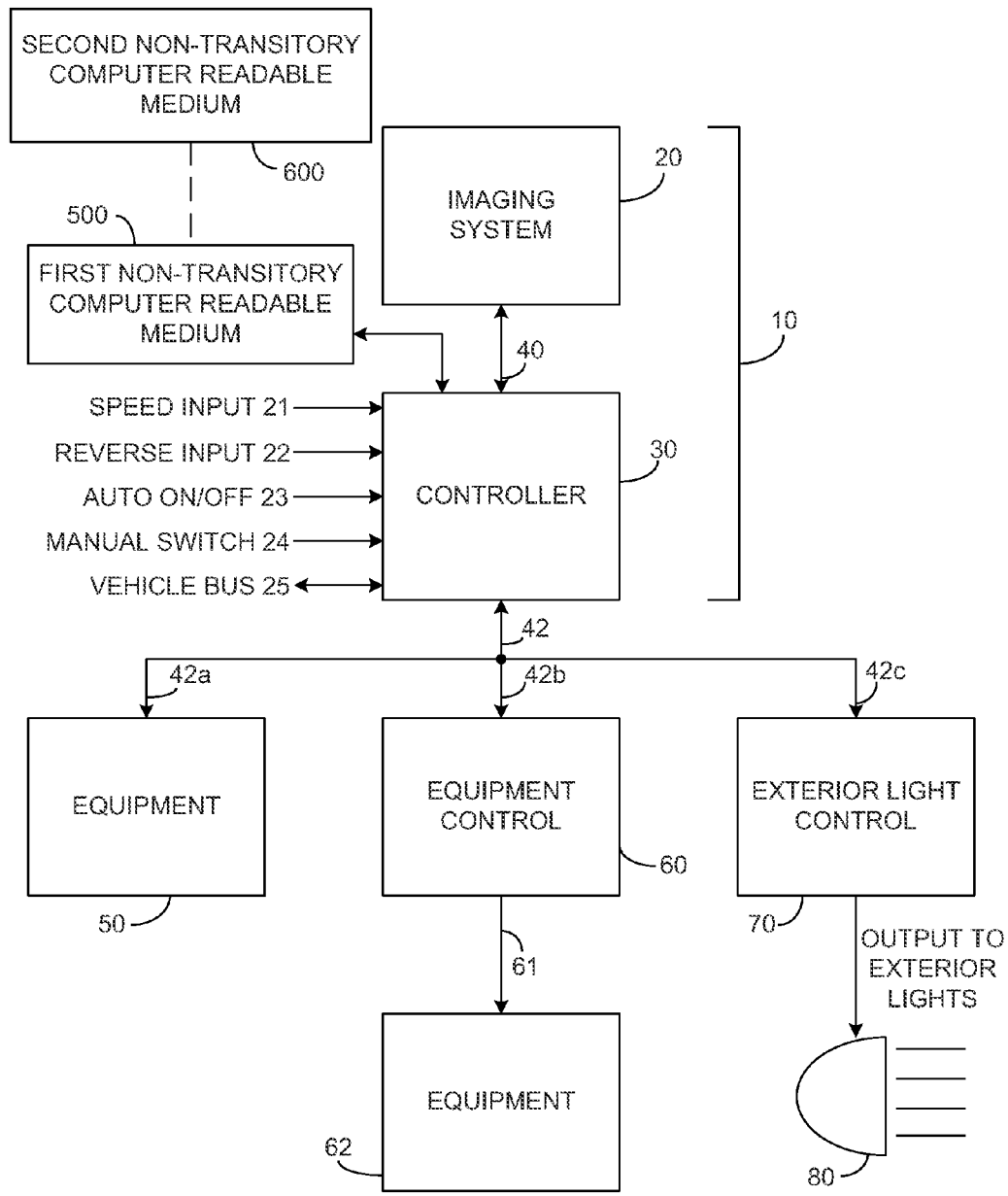
FIG. 1 is a block diagram of a vehicle control system constructed according to an embodiment of the present invention.

Reference will now be made in detail to the present preferred embodiments of the invention, examples of which are illustrated in the accompany drawings. Wherever possible, the same reference numerals will be used throughout the drawings to refer to the same or like parts. In the drawings, the depicted structural elements are not to scale and certain components are enlarged relative to the other components for purposes of emphasis and understanding.

A first embodiment of system 10 is shown in FIG. 1. System 10 is provided for controlling equipment (50, 62, and 80) of a controlled vehicle (such as 5000, FIGS. 5A-5D). System 10 includes an imaging system 20 and a controller 30. Imaging system 20 is configured to image a scene external and forward of the controlled vehicle and to generate image data corresponding to the acquired images. Controller 30 receives and analyzes the image data and generates a control signal that is transmitted to the equipment to be controlled. The control signal is generated in response to analysis of the image data and in response to a selected mode of operation. Controller 30 also analyzes the image data to detect at least one characteristic of the image data. In addition, controller 30 selects a mode of operation from at least one of a dark village mode, a bright village mode, and at least one non-village mode. Controller 30 selects a dark village mode if the characteristic reaches a first threshold. Controller 30 selects a bright village mode if the characteristic reaches a second threshold. Controller 30 selects one of the non-village modes if the conditions for selecting the dark village mode or the bright village mode are not met.

The characteristic of the image data may include at least one of an Average Ambient Light Level, a number of light level peaks, and a number/density of AC powered light sources in the external scene. Controller 30 selects a dark village mode if at least one of these conditions is met: the Average Ambient Light Level of a portion of the external scene reaches a first ambient threshold level, the number of light level peaks detected in the upper portion of the external scene reaches a first peak threshold, and the number/density of AC powered light sources in at least a portion of the external scene reaches a first AC powered light source threshold. Controller 30 selects a bright village mode if at least one of these conditions is met: the Average Ambient Light Level of a portion of the external scene reaches a second ambient threshold level, the number of light level peaks detected in the upper portion of the external scene reaches a second peak threshold, and the number/density of AC powered light sources in at least a portion of the external scene reaches a second AC powered light source threshold.

According to another embodiment, the equipment that system 10 controls may include one or more exterior lights 80 and the control signal generated by controller 30 may be an exterior light control signal. This particular embodiment may thus provide automatic selection of different exterior lighting modes of a vehicle as the vehicle transitions from and into different environments, such as a darkly lit or "dark" village, a well lit or "bright" village, or a non-village environment.

Prior systems are known for controlling exterior vehicle lights in response to images captured forward of the vehicle. In these prior systems, a controller would analyze the captured images and determine if any preceding or oncoming vehicles were present in a glare area in front of the vehicle employing the system. This "glare area" was the area in which the exterior lights would cause excessive glare to a driver if the exterior lights were in a high beam state (or some state other than a low beam state). If a vehicle was present in the glare area, the controller would respond by changing the state of the exterior lights so as to not cause glare for the other driver(s). Examples of such systems are described in U.S. Pat. Nos. 5,837,994, 5,990,469, 6,008,486, 6,049,171, 6,130,421, 6,130,448, 6,166,698, 6,379,013, 6,403,942, 6,587,573, 6,611,610, 6,631,316, 6,774,988, 6,861,809, 7,321,112, 7,417,221, 7,565,006, 7,567,291, 7,653,215, 7,683,326, 7,881,839, 8,045,760, and 8,120,652, the entire disclosures of which are incorporated herein by reference.

In some of the prior systems, the controller would analyze the captured images to detect whether the vehicle was in or entering a village (or town). The controller would then typically either place the exterior lights in a low beam state or otherwise inhibit operation of high beam headlamps. Examples of such systems are described in U.S. Pat. Nos. 6,861,809, 7,565,006, and 8,045,760, the entire disclosures of which are incorporated herein by reference.

By not only identifying villages, but by also distinguishing between bright villages and dark villages, system 10 advantageously provides more flexibility in how the exterior lights are controlled in such environments. For example, in a bright village, it may be desirable to place the exterior lights in a low beam state or otherwise inhibit operation of high beam headlamps (see FIG. 5A, for example), whereas in a darker village, it may be desirable to allow some operation of exterior lights in states other than just the low beam state so as to illuminate areas to the sides of the road where pedestrians may be present (see FIG. 5B, for example). It should be appreciated that the present invention is not limited to the specific manner by which a vehicle manufacturer chooses to respond to the indication of a bright village or a dark village; however, by providing this information, system 10 allows the vehicle manufacturers flexibility in how they choose to have the exterior light control 70 respond in the different types of detected villages. It is also possible that system 10 may further distinguish villages into more than two types.

As used herein, a "non-village mode" is not necessarily a single mode of operation. Such modes may include a normal or default mode, as well as a motorway mode in which the exterior light pattern may be even brighter or have a greater range than a typical high beam pattern such as illustrated in FIGS. 5C and 5D, for example.

Operation

The method for controlling the equipment of the controlled vehicle will now be described with reference to FIGS. 1, 3, and 4. This method is described below as being implemented by controller 30 using image data received from imaging system 20. This method may be executed by any processor, and thus this method may be embodied in a non-transitory computer readable medium having stored thereon software instructions that, when executed by a processor, cause the processor to control the equipment of the controlled vehicle, by executing the steps of the method described below. In other words, aspects of the inventive method may be achieved by software stored on a non-transitory computer readable medium or software modifications or updates to existing software residing in a non-transitory computer readable medium. Such software or software updates may be downloaded into a first non-transitory computer readable media 500 of controller 30 (or locally associated with some processor) typically prior to being installed in a vehicle, from a second non-transitory computer readable media 600 located remote from first non-transitory computer readable media 500. Second non-transitory computer readable media 600 may be in communication with first non-transitory computer readable media 500 by any suitable means, which may at least partially include the Internet or a local or wide area wired or wireless network.

Figure 3:
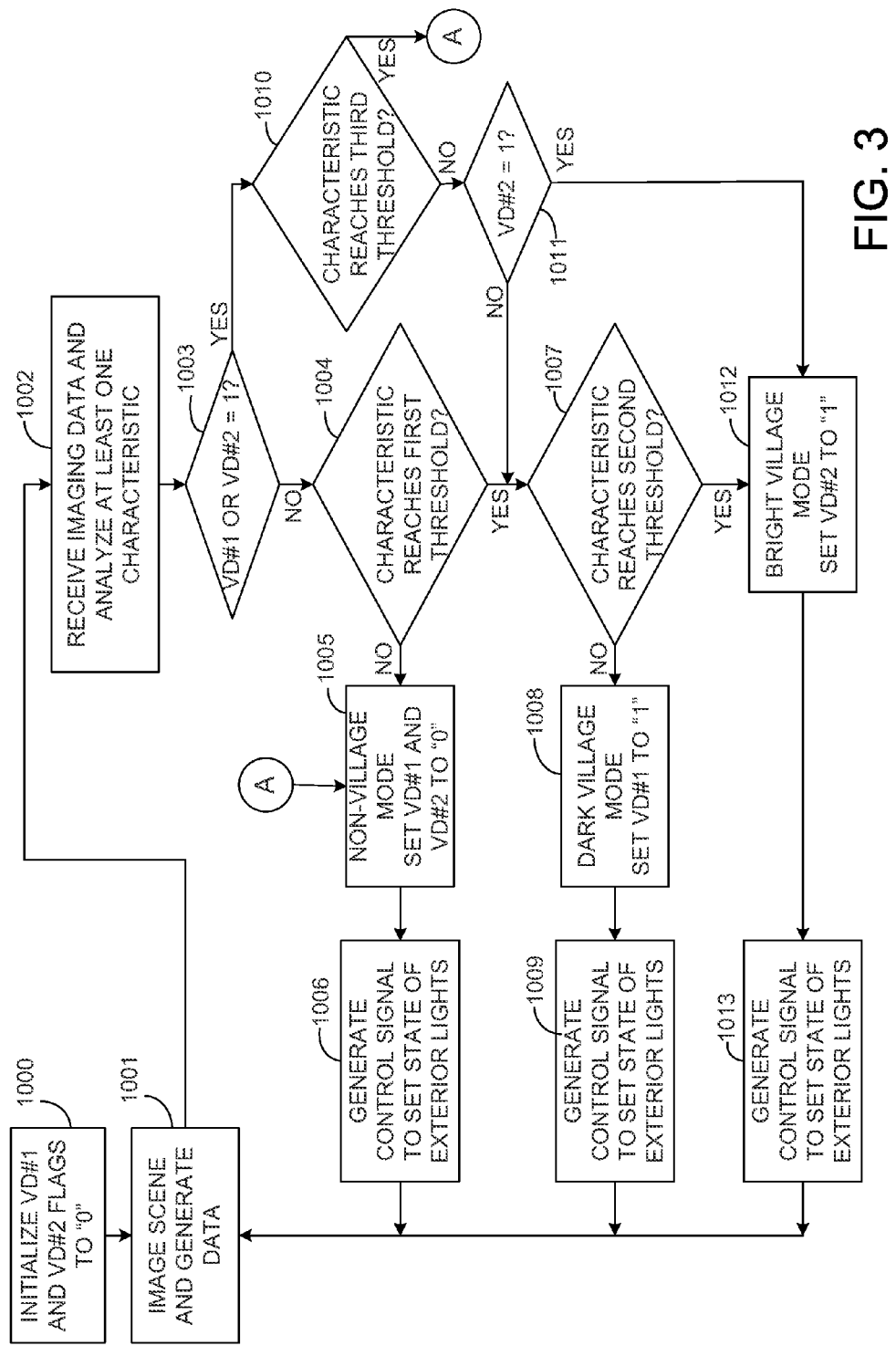
FIG. 3 is a flow chart illustrating operation of the vehicle control system.
Figure 4:
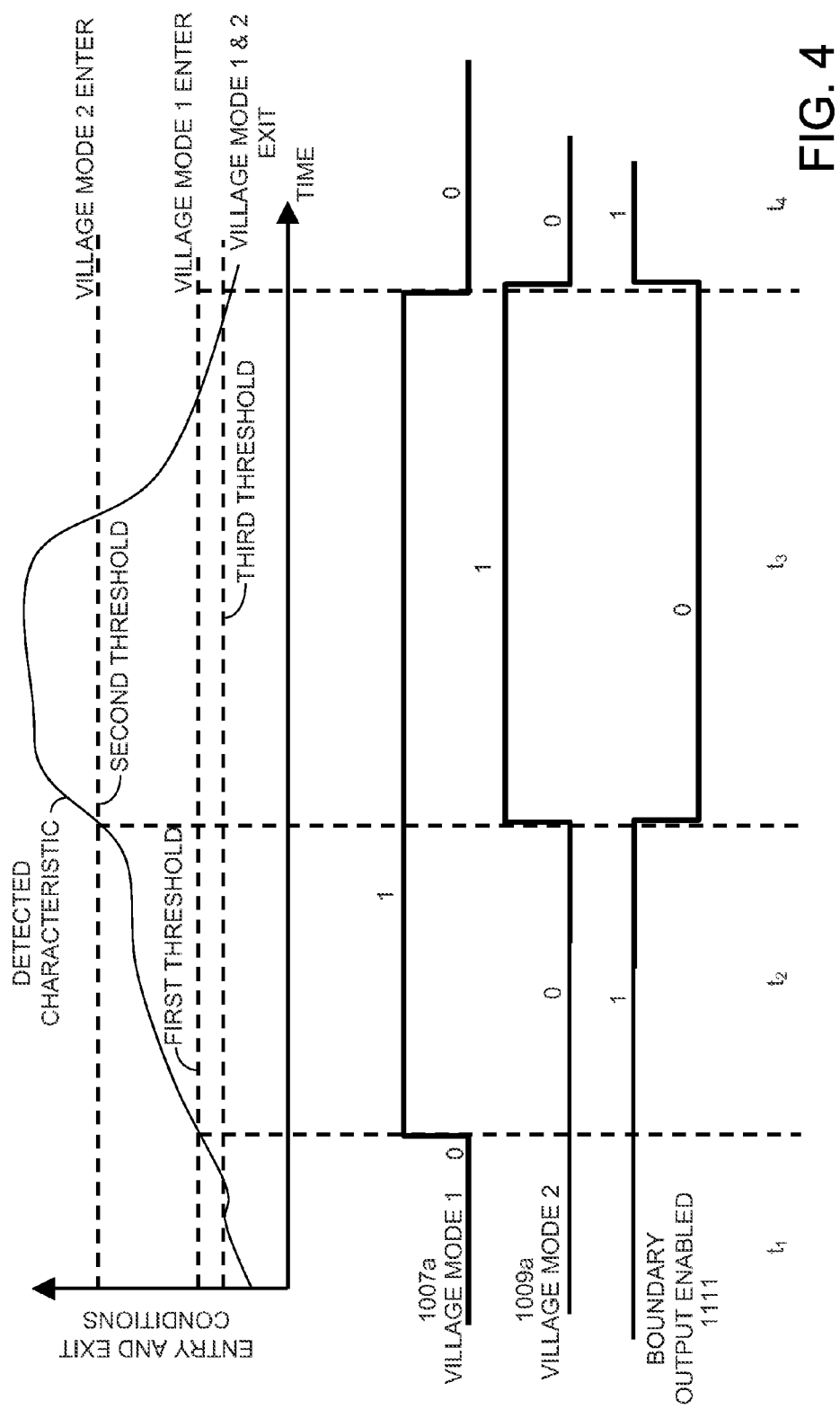
FIG. 4 is a graph illustrating entry and exit conditions of modes of operation as a function of time.

FIG. 3 shows a general flow chart illustrating various steps to be executed by controller 30. FIG. 4 graphically illustrates an example of a detected characteristic (in this specific example Average Ambient Light Levels) from image data obtained from the forward scene as well as various thresholds and responses of controller 30 when the characteristic reaches those thresholds.

As shown in FIG. 3, the method may begin with step 1000 in which a first village detect flag VD#1 and a second village detect flag VD#2 are initialized by setting them equal to "0," for example. Next, in step 1001, a scene external and forward of the controlled vehicle is imaged and image data is generated corresponding to the acquired images. Then, controller 30 receives and analyzes the image data to detect at least one characteristic of the image data in step 1002.

The at least one characteristic may include one of the following: an Average Ambient Light Level of at least a portion of the measured external scene, a number of light level peaks detected in an upper portion of the external scene, and a number/density of AC power light sources in at least a portion of the external scene of the image.

The ambient light level of the image may be used to give an approximate measurement of the luminance of the external scene. Approximately the upper fifteen rows of the image data corresponding to the external scene may be measured to approximate the Average Ambient Light Level in the image data. Average Ambient Light Level can be an indication that the vehicle has entered a dark village, a well lit (bright) village, or that it has not entered a village (a non-village). Optionally, there may be a Long Average Ambient threshold that will trigger entrance into a village detection mode and there may be a Short Average Ambient threshold that will trigger exit from a village detection mode.

Brightness levels found in the upper portion of an image can be an indication of the vehicle entering a dark village, a well lit (bright) village, or a non-village. Higher brightness peaks usually indicate detection of street lights in the image thereby indicating that the vehicle has entered a bright village. Approximately the upper twenty rows of the image can be measured to determine the "street light" brightness of the image.

A count or average density of AC power light sources in an image can be an indication that the vehicle has entered a dark village, a well lit (bright) village, or a non-village. Higher numbers of AC light sources may be an indication that the vehicle has entered a well lit area or village. A count of approximately sixteen AC power lights or computation of density of AC power lights in a given time or distance in the image can indicate the vehicle has entered a bright village. This ability to detect AC light sources, described in commonly assigned U.S. Pat. No. 5,837,994, which is incorporated herein in its entirety by reference, enables the computation of the number and/or density of AC light sources.

Following step 1002, controller 30 may then determine whether flags VD#1 or VD#2 have been set to "1" in step 1003. Initially, these flags will be set to "0" due to initialization step 1000 so controller 30 would first proceed to step 1004. In step 1004, controller 30 then compares the characteristic in the analyzed image data to a predetermined first threshold in order to determine if the image data reaches or exceeds the first threshold.

In one embodiment, if the characteristic of the analyzed image data is the Average Ambient Light Level, the controller in step 1004 will compare the Average Ambient Light Level with a first ambient threshold. If the Ambient Light Level does not reach the first ambient threshold, controller 30 will select a non-village mode in step 1005 and set VD#1 and VD#2 to "0" if they are not already at "0." If the characteristic of the analyzed image data is the number of light level peaks detected in the upper portion of the external scene, the controller in step 1004 will compare the number of light level peaks with a first peak threshold. If the number of light level peaks does not reach the first peak threshold, controller 30 will select a non-village mode in step 1005. If the characteristic of the analyzed image data is the number/density of AC powered light sources in at least a portion of the external scene, the controller in step 1004 will compare the number/density of AC powered light sources with a first AC powered light source threshold. If the number/density of AC powered light sources does not reach the first AC powered light source threshold, controller 30 will select a non-village mode in step 1005.

Next, in step 1006, controller 30 generates a control signal that may be transmitted to the equipment to be controlled in response to analysis of the image data and in response to a selected mode of operation to control the state of the equipment (50, 62, and/or exterior lights 80). In generating the control signal, controller 30 may also take into account any vehicles detected in the image data as may be typical in such systems, and as is typical in exterior light control systems.

After step 1006, controller 30 returns to step 1001 to cause imaging system 20 to capture another image of the forward scene. Controller 30 continues to loop through steps 1001 through 1006 until such time that controller 30 determines in step 1004 that the characteristic has reached the first threshold.

Referring to the example shown in FIG. 4, the detected Average Ambient Light Level is initially below the first threshold for a time period $t_1$ after which it reaches the first threshold. During this time period, village modes 1 and 2 depicted by lines 1007*a* and 1009*a* are at a "0" level, which corresponds to the values of flags VD#1 and VD#2, respectively.

If the characteristic reaches the first threshold as determined in step 1004, controller 30 compares the characteristic to a second threshold in step 1007. If the characteristic of the analyzed image data is the ambient light level, the controller will compare the ambient light level with a second ambient threshold. If the characteristic of the analyzed image data is the number of light level peaks detected in the upper portion of the external scene, the controller in step 1007 will compare the number of light level peaks with a second peak threshold. If the characteristic of the analyzed image data is the number/density of AC powered light sources in at least a portion of the external scene, the controller in step 1007 will compare the number/density of AC powered light sources with a second AC powered light source threshold.

If the characteristic has reached the first threshold, but not yet reached the second threshold, which is typically higher than the first threshold, controller 30 selects a dark village mode and sets VD#1 to "1" in step 1008. This is depicted in the example shown in FIG. 4 where village mode 1 changes states from "0" to "1" at the time when the detected characteristic reaches the first threshold. Following step 1008, controller 30 generates a control signal that sets the control state of the vehicle equipment such as exterior lights 80 in step 1009. In generating the control signal in step 1009, controller 30 may again also take into account any vehicles detected in the image data as may be typical in such systems. The controller then returns to steps 1001 and 1002 in which a next image is acquired and analyzed.

Following step 1002, controller 30 would then determine in step 1003 that VD#1 has been set to "1." In this case, controller 30 then compares the characteristic to a third threshold in step 1010. As discussed further below and shown in FIG. 4, the third threshold may be lower than the first threshold. If the characteristic has not reached the third threshold, controller 30 then determines if VD#2 is equal to "1." If not, controller 30 determines whether the characteristic has reached the second threshold in step 1007. If not, controller 30 maintains the selection of the dark village mode and continues to generate control signals accordingly. Thus, controller 30 would loop through steps 1001, 1002, 1003, 1010, 1011, 1007, 1008, and 1009 until the characteristic reaches either the second or third threshold. It should be noted that controller 30 may be programmed to only generate control signals when a change in mode occurs or when some other condition occurs such as the detection of other vehicles, which would or may cause a change in the operation of the equipment (i.e., a change in the illumination pattern of produced by exterior lights 80).

If, in step 1007, controller 30 determines that the characteristic has reached the second threshold, controller 30 selects a bright village mode and sets flag VD#1 to "1" in step 1012. In the example shown in FIG. 4, this occurs after time period t$_2$. As also shown in FIG. 4, village mode 2 transitions from "0" to "1" at this time.

Controller 30 then generates an appropriate control signal in step 1013 before returning to steps 1001 and 1002. As discussed further below, in the case of exterior light control, this control signal may cause the boundary output to be disabled such that some or all of the brighter illumination patterns may be inhibited. This is depicted in FIG. 4 by boundary output enabled 1111 to transition from "1" to "0."

To provide some hysteresis, the third threshold, which is the one used to subsequently exit the village modes, may be lower than both the first and second thresholds. This is advantageous as it may prevent the controller 30 from flickering back and forth between states if the characteristic is fluctuating near one of the first and second thresholds. Of course, an alternative approach would be to exit a respective one of the village modes a predetermined time after the characteristic falls below the first or second threshold.

Referring back to FIG. 3, after returning to steps 1001 and 1002 from step 1013, controller 30 determines in step 1003 that VD#2 is equal to "1" and then executes step 1010 in which it determines whether the characteristic has reached the third threshold. If not, controller 30 determines in step 1011 that VD#2 is equal to "1," which causes controller 30 to skip step 1007 and proceed to step 1012. Thus, controller 30 maintains the selection of the bright village mode and continues to generate control signals accordingly. Thus, controller 30 would loop through steps 1001, 1002, 1003, 1010, 1011, 1012, and 1013 until the characteristic reaches the third threshold as determined in step 1010. Note that in this example, the bright village mode is exited using the same "third" threshold as used for exiting the dark village mode, and therefore the system is prevented from transition from the bright village mode to the dark village mode. However, a different threshold may be used to exit the bright village mode that is lower than the second threshold, but possibly higher than the second threshold such that the system could transition from the bright village mode to the dark village mode.

In the event that the characteristic reaches the third threshold in step 1010, controller 30 then executes step 1005 in which it selects a non-village mode and sets both the flags VD#1 and VD#2 to "0." Controller 30 then generates an appropriate control signal in step 1006 before returning to steps 1001 and 1002. As discussed further below, in the case of exterior light control, this control signal may cause the boundary output to be enabled such that some or all of the brighter illumination patterns may be permitted. This is depicted in FIG. 4 by boundary output enabled 1111 to transition from "0" to "1" after time t$_3$.

In additional embodiments, if at least one detected characteristic is the Average Ambient Light Level, the second ambient threshold level may represent a greater Average Ambient Light Level than the first ambient threshold value. Optionally, if at least one detected characteristic is the number of light level peaks, the second peak threshold may represent a greater number of peaks than the first peak threshold and if at least one detected characteristic is the number/density of AC powered light sources, the second AC powered light source may optionally represent a greater number/density of peaks than the first AC powered light source threshold.

Optionally, the dark village mode may be selected when the Average Ambient Level of at least a portion of the external scene reaches the first ambient threshold level for a predetermined amount of time. Optionally, the bright village mode may be selected when the Average Ambient Light Level of at least a portion of the external scene reaches the second ambient threshold level for a predetermined amount of time.

Optionally, the number of light level peaks detected in the upper portion of the external scene may correspond to the number of street lights detected in the image data. Optionally, the first peak threshold or second peak threshold amount may be at least sixteen light level peaks. Controller 30 may be configured to directly connect to the equipment (50) being controlled such that the generated control signals directly control the equipment. Alternatively, controller 30 may be configured to connect to an equipment control (60 and 70), which, in turn, is connected to the equipment being controlled (62 and 80) such that the control signals generated by controller 30 only indirectly control the equipment. For example, in the case of exterior lights, controller 30 may analyze the image data from imaging system 20 so as to generate control signals that are more of a recommendation for exterior light control (70) to use when controlling exterior lights (80). The control signals may further include not just a recommendation, but also a code representing a reason for the recommendation so that equipment control (60 and 70) may determine whether or not to override a recommendation.

As shown in FIG. 1, various inputs (such as inputs 21-24) may be provided to controller 30 that may be taken into account in forming a recommendation or direct control signal. In some cases, such inputs may instead be provided instead to equipment control (60 and 70). For example, input from manual switches may be provided to equipment control (60 and 70), which may allow equipment control (60 and 70) to override a recommendation from controller 30. It will be appreciated that various levels of interaction and cooperation between controller 30 and equipment controls (60 and 70) may exist. One reason for separating control functions is to allow imaging system 20 to be located in the best location in the vehicle for obtaining images, which may be a distance from the equipment to be controlled and to allow communication over the vehicle bus.

In the example shown in FIG. 1, imaging system 20 may be controlled by controller 30. Communication of imaging system parameters as well as image data occurs over communication bus 40, which may be a bi-directional serial bus, parallel bus, a combination of both, or other suitable means. Controller 30 serves to perform exterior light control functions by analyzing images from imaging system 20, determining an equipment (or exterior light) state based upon information detected within those images, and communicating the determined equipment (or exterior light) state to the equipment 50, equipment control 60, or exterior light control 70 through bus 42, which may be a CAN bus, a LIN bus or any other suitable communication link. Controller 30 may control the imaging system to be activated in several different modes with different exposure times and different readout windows. Because of this complexity, controller 30 may be used to both perform the equipment or exterior light control function and control the parameters of imaging system 20. Other functions include receiving image data from imaging system without needing direct imaging system control required by the exterior light control function. Thus, the image data from imaging system 20 can be communicated to one or more equipment or equipment control modules (shown as 50 and 60) from controller 30 through an image data link 42. The image data link may be a MOST bus, a high-speed CAN bus, or any other suitable electronic data communication scheme. The communication can be uni-directional or bi-directional.

Controller 30 may perform some pre-processing such as filtering, dynamic range compression, or color computation on the images before transmission over image data link 42 to the other modules 50, 60 and 70. The controller 30 can also take advantage of the availability of signals (such as vehicle speed) communicated over the vehicle's electrical bus in making decisions regarding the operation of the exterior lights 80. In particular, speed input 21 provides vehicle speed information to the controller 30 from which speed can be a factor in determining the control state for the exterior lights 80. The reverse signal 22 informs controller 30 that the vehicle is in reverse, responsive to which the controller 30 may clear an electrochromic mirror element regardless of signals output from light sensors. Auto ON/OFF switch input 23 is connected to a switch having two states to dictate to controller 30 whether the vehicle exterior lights 80 should be automatically or manually controlled. The auto ON/OFF switch (not shown) connected to the ON/OFF switch input 23 may be incorporated with the headlamp switches that are traditionally mounted on the vehicle dashboard or incorporated into steering wheel column levels. Manual dimmer switch input 24 is connected to a manually actuated switch (not shown) to provide a manual override signal for an exterior light control state. Some or all of the inputs 21, 22, 23, 24 and outputs 42*a*, 42*b*, and 42*c* as well as any other possible inputs or outputs, such as a steering wheel input, can optionally be provided through a vehicle communications bus 25 shown in FIG. 1. Alternatively, these inputs 21-24 may be provided to equipment control 60 or exterior light control 70.

Controller 30 can control, at least in part, other equipment 50 within the vehicle which is connected to controller 30 via vehicle bus 42. Specifically, the following are some examples of one or more equipment 50 that may be controlled by controller 30: exterior lights 80, a rain sensor, a compass, information displays, windshield wipers, a heater, a defroster, a defogger, an air conditioning system, a telephone system, a navigation system, a security system, a tire pressure monitoring system, a garage door opening transmitter, a remote keyless entry system, a telematics system, a voice recognition system such as a digital signal processor-based voice actuation system, a vehicle speed control, interior lights, rearview mirrors, an audio system, an engine control system, and various other switches and other display devices that may be located throughout the vehicle.

In addition, controller 30 may be, at least in part, located within a rearview assembly of a vehicle or located elsewhere within the vehicle. The controller 30 may also use a second controller (or controllers), equipment control 60, which may be located in a rearview assembly or elsewhere in the vehicle in order to control certain kinds of equipment 62. Equipment control 60 can be connected to receive via vehicle bus 42 control signals generated by controller 30. Equipment control 60 subsequently communicates and controls equipment 62 via bus 61. For example, equipment control 60 may be a windshield wiper control unit which controls windshield wiper equipment, turning this equipment ON or OFF. Equipment control 60 may also be an electrochromic mirror control unit where controller 30 is programmed to communicate with the electrochromic control unit in order for the electrochromic control unit to change the reflectivity of the electrochromic mirror(s) in response to information obtained from an ambient light sensor, a glare sensor, as well as any other components coupled to the processor. Specifically, equipment control unit 60 in communication with controller 30 may control the following equipment: exterior lights, a rain sensor, a compass, information displays, windshield wipers, a heater, a defroster, a defogger, air conditioning, a telephone system, a navigation system, a security system, a tire pressure monitoring system, a garage door opening transmitter, a remote keyless entry system, a telemetry system, a voice recognition system such as a digital signal processor-based voice actuation system, a vehicle speed control, interior lights, rearview mirrors, an audio system, a climate control, an engine control, and various other switches and other display devices that may be located throughout the vehicle.

Figure 2:
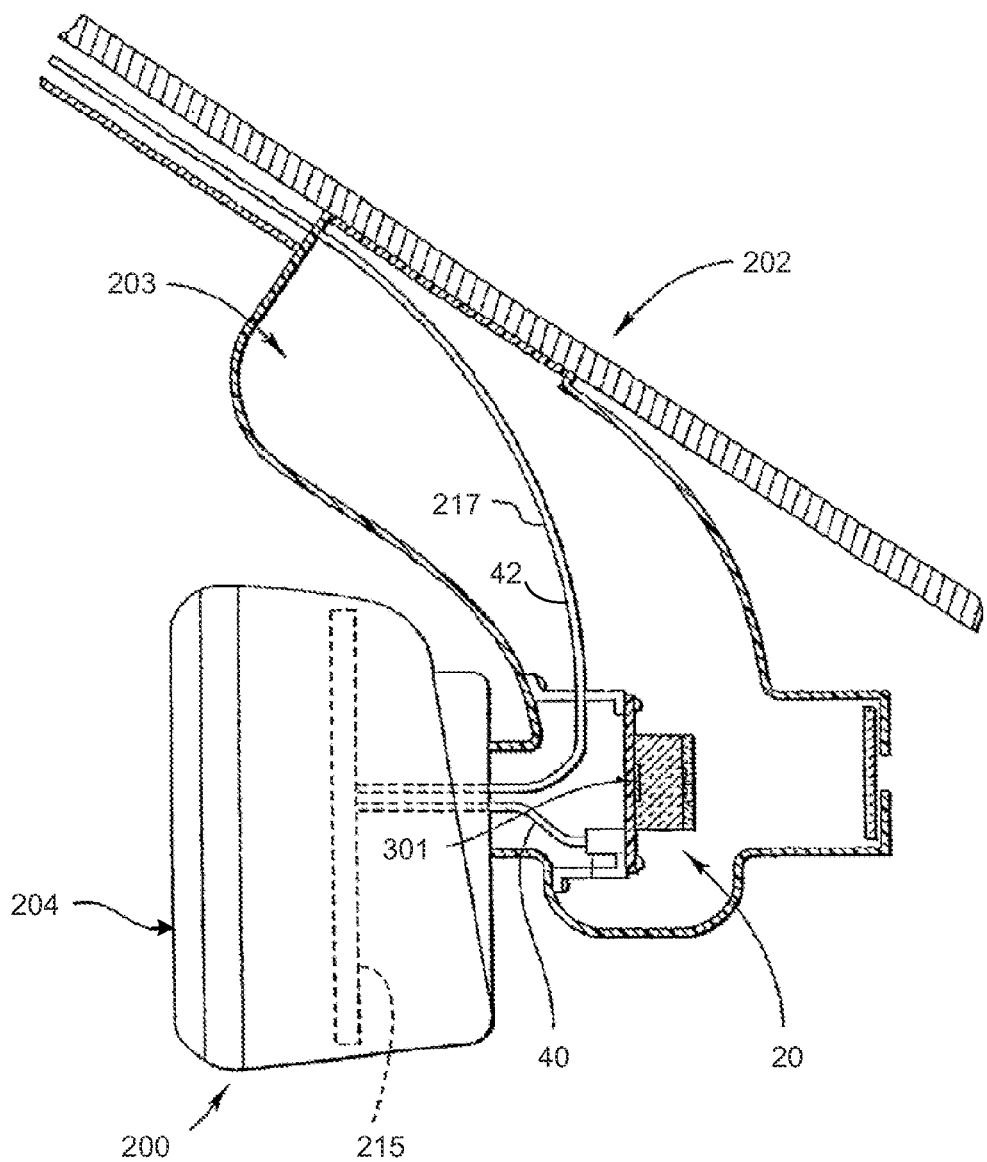
FIG. 2 is a partial cross section of a rearview mirror assembly incorporating the control system of FIG. 1.

Portions of system 10 can be advantageously integrated into a rearview assembly 200 as illustrated in FIG. 2, wherein imaging system 20 is integrated into a mount 203 of rearview assembly 200. This location provides an unobstructed forward view through a region of the windshield 202 of the vehicle that is typically cleaned by the vehicle's windshield wipers (not shown). Additionally, mounting the image sensor 301 of imaging system 20 in the rearview assembly permits sharing of circuitry such as the power supply, microcontroller and light sensors.

Referring to FIG. 2, image sensor 301 is mounted within rearview mount 203, which is mounted to vehicle windshield 202. The rearview mount 203 provides an opaque enclosure for the image sensor with the exception of an aperture through which light is received from a forward external scene.

Controller 30 of FIG. 1 may be provided on a main circuit board 215 and mounted in rearview housing 204 as shown in FIG. 2. As discussed above, controller 30 may be connected to imaging system 20 by a bus 40 or other means. The main circuit board 215 may be mounted within rearview housing 204 by conventional means. Power and a communication link 42 connects to the vehicle electrical system, which includes the exterior lights 80 (FIG. 1) via a vehicle wiring harness 217 (FIG. 2).

Rearview assembly 200 may include a mirror element 204 or a display that displays a rearward view. Mirror element 204 may be a prismatic element or an electro-optic element, such as an electrochromic element.

Additional details of the manner by which system 10 may be integrated into a rearview mirror assembly 200 are described in U.S. Pat. No. 6,611,610, the entire disclosure of which is incorporated herein by reference. Alternative rearview mirror assembly constructions used to implement exterior light control systems are disclosed in U.S. Pat. No. 6,587,573, the entire disclosure of which is incorporated herein by reference.

As noted above, one embodiment of the present invention generally pertains to a control system for controlling the exterior lights of a vehicle. As used herein, the "exterior lights" broadly includes any exterior lighting on the vehicle. Such exterior lights may include headlamps (both low and high beam if separate from one another), tail lights, foul weather lights such as fog lights, brake lights, center-mounted stop lights (CHMSLs), turn signals, back-up lights, etc. The exterior lights may be operated in several different modes including conventional low-beam and high-beam states. They may also be operated as daytime running lights, and additionally as super-bright high beams in those countries where they are permitted.

The exterior light brightness may also be continuously varied between the low, high, and super-high states. Separate lights may be provided for obtaining each of these exterior lighting states or the actual brightness of the exterior lights may be varied to provide these different exterior lighting states. In either case, the "perceived brightness" or illumination pattern of the exterior lights is varied. As used herein, the term "perceived brightness" means the brightness of the exterior lights as perceived by an observer outside the vehicle. Most typically, such observers will be drivers or passengers in a preceding vehicle or in a vehicle traveling along the same street in the opposite direction. Ideally, the exterior lights are controlled such that if an observer is located in a vehicle within a "glare area" relative to the vehicle (i.e., the area in which the observer would perceive the brightness of the exterior lights as causing excessive glare), the beam illumination pattern is varied such that the observer is no longer in the glare area. The perceived brightness and/or glare area of the exterior lights may be varied by changing the illumination output of one or more exterior lights, by steering one or more lights to change the aim of one or more of the exterior lights, selectively blocking or otherwise activating or deactivating some or all of the exterior lights, altering the illumination pattern forward of the vehicle, or a combination of the above.

Figure 5A:
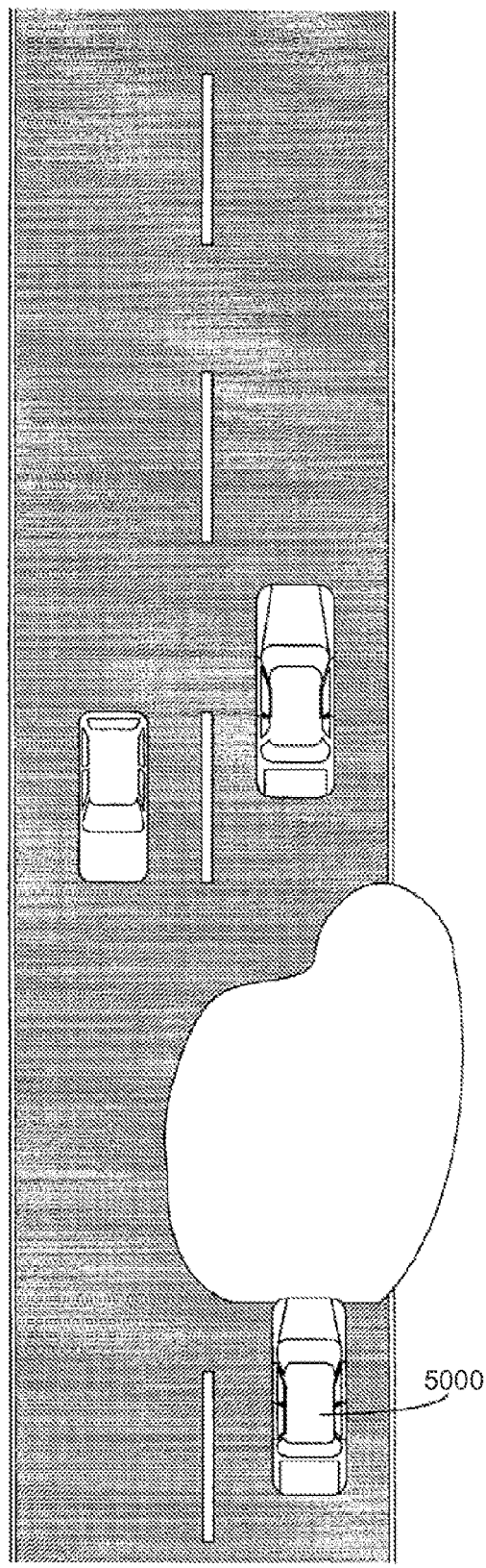
FIGS. 5A-5D are pictorial representations of various illumination patterns produced by exterior lights of a vehicle.
Figure 5B:
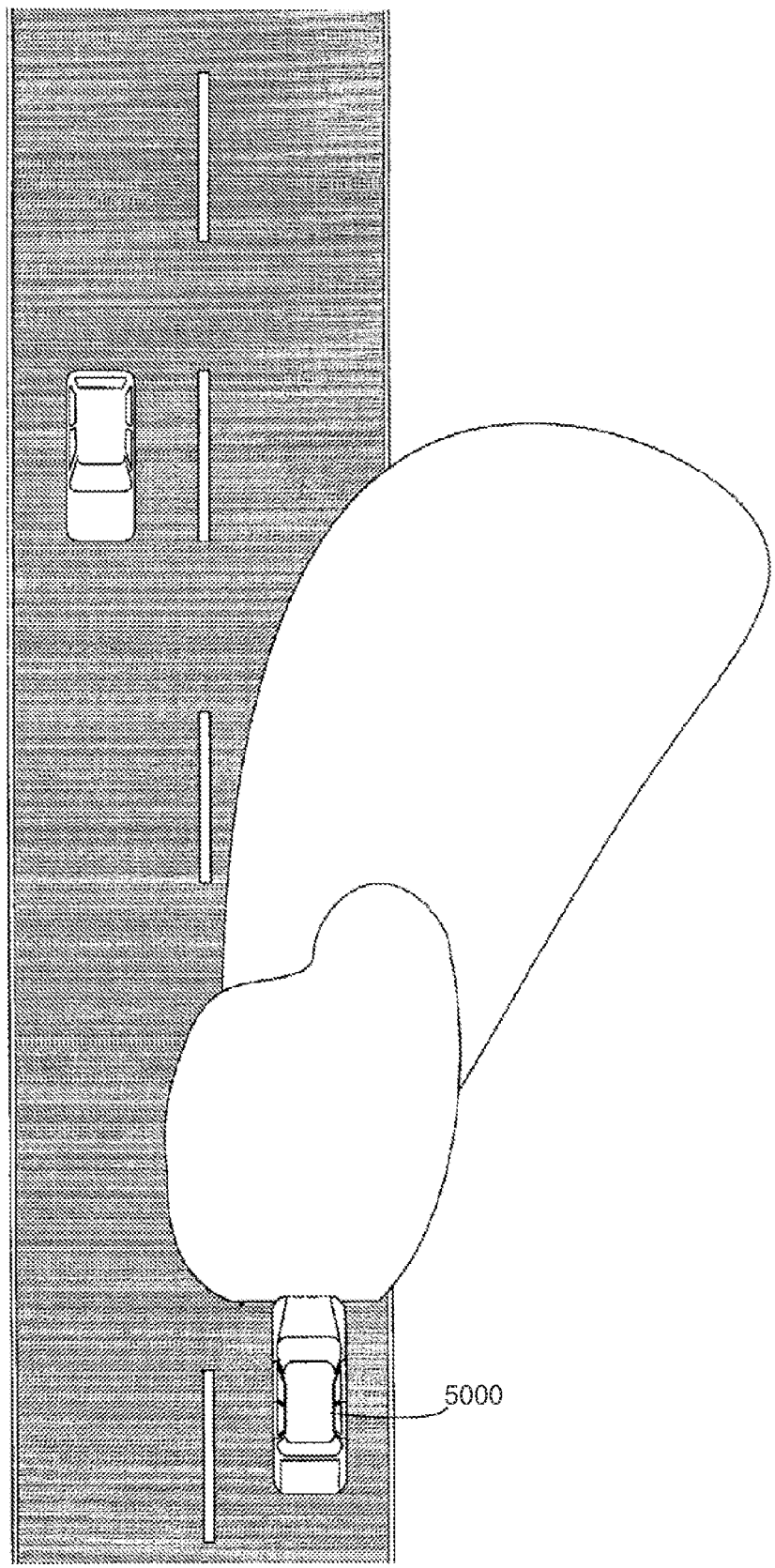
Figure 5C:
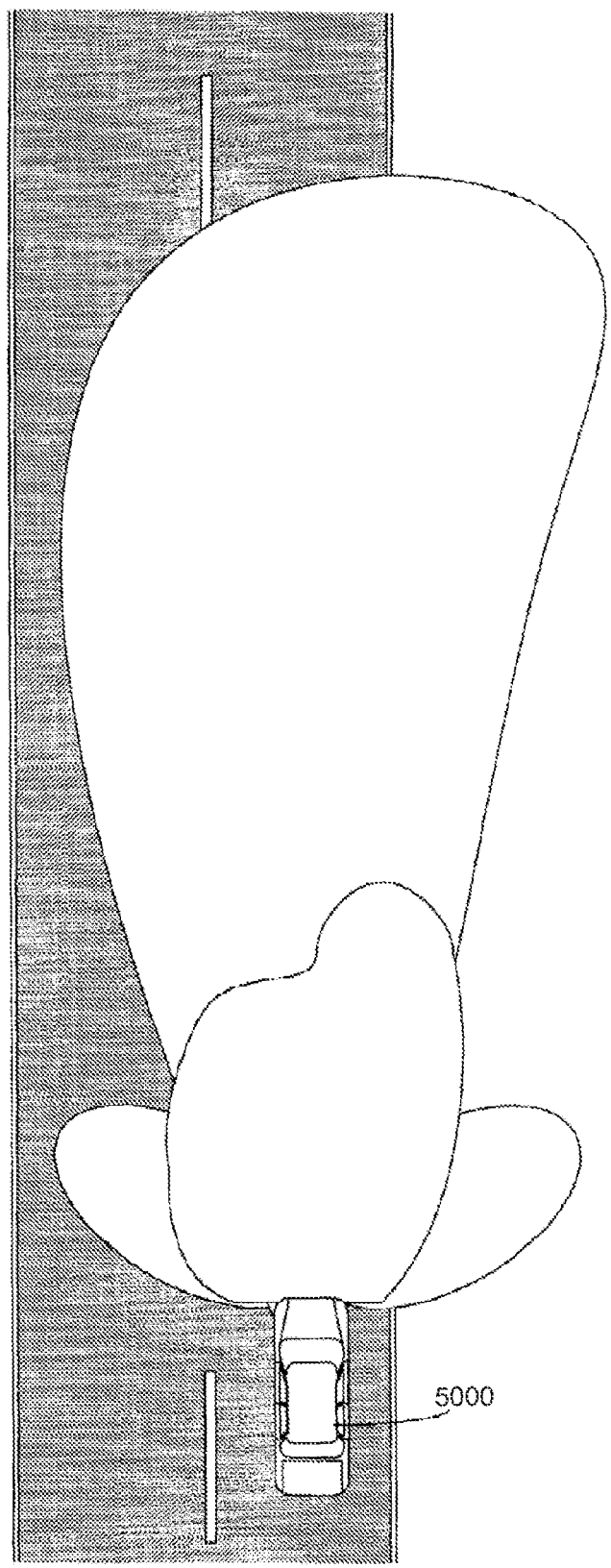
Figure 5D:
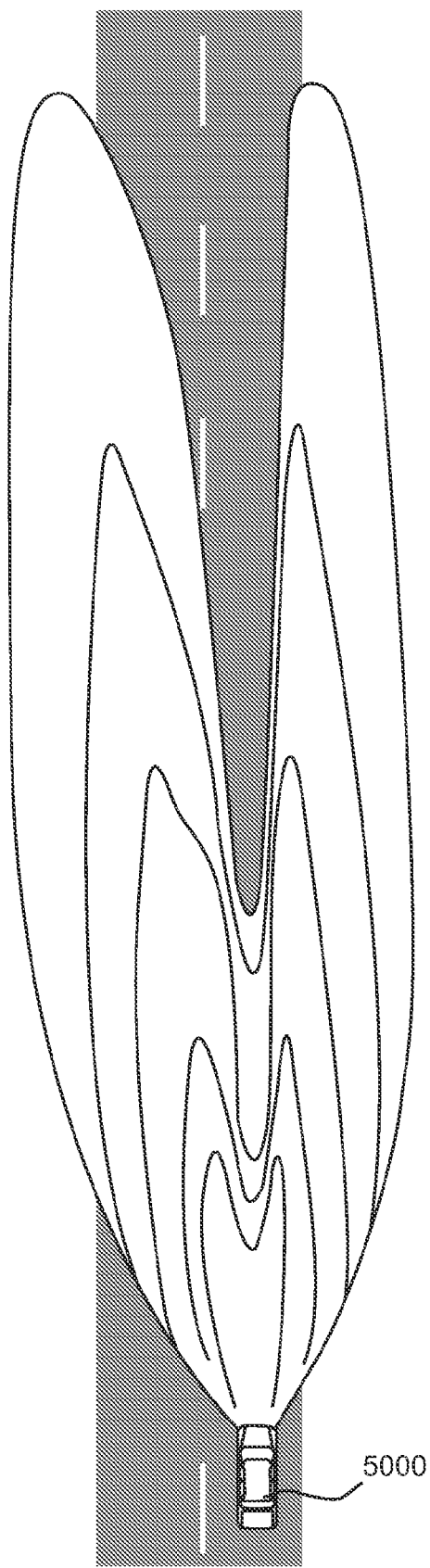

FIG. 5A shows a typical exterior light pattern emitted from a controlled vehicle 5000 that may be set in bright village mode. The beam pattern in FIG. 5A may be a typical low beam pattern. The illumination pattern shown in FIG. 5A may also be used when in a dark village mode or a non-village mode when other vehicles are present in glare areas. FIG. 5B shows an exemplary exterior light pattern including both high and low beam patterns where the high-beam pattern is aimed to the side of the road, which may be activated in dark village mode or non-village mode when other vehicles are present in a glare area. Similarly, FIG. 5C illustrates another composite beam pattern including a low-beam pattern and an intermediate, side aimed pattern, which may be produced by fog lights, as well as a high-beam pattern which may be emitted while the vehicle is operating in dark village mode or non-village mode. The composite beam pattern shown in FIG. 5C is useful when another vehicle is not approaching in an oncoming and adjacent lane or proceeding in the same or adjacent lane to controlled vehicle 5000. FIG. 5D illustrates another composite beam pattern produced by an adaptive forward lighting (AFL) system. As will be apparent to those skilled in the art, a large number of other beam patterns can be achieved using known exterior light mechanisms. Other mechanisms for adjusting the perceived brightness and glare area of the exterior lights will also be apparent to those skilled in the art.

Although some of the above embodiments have been described as relating to an exterior light control system, features of the present invention may be used in lane departure warning systems, forward collision warning systems, adaptive cruise control systems, pedestrian detection systems, night vision systems, terrain detection systems, parking assist systems, and traffic sign recognition systems.

The above description is considered that of the preferred embodiments only. Modifications of the invention will occur to those skilled in the art and to those who make or use the invention. Therefore, it is understood that the embodiments shown in the drawings and described above are merely for illustrative purposes and not intended to limit the scope of the invention, which is defined by the claims as interpreted according to the principles of patent law, including the doctrine of equivalents.

What is claimed is:

1. A system for controlling equipment of a controlled vehicle, comprising:
   an imaging system configured to image a scene external and forward of the controlled vehicle and to generate image data corresponding to the acquired images; and
   a controller configured to receive and analyze the image data and for generating a control signal that is used to control the equipment, said controller configured to generate the control signal in response to analysis of the image data and in response to a selected mode of operation,
   wherein said controller analyzes the image data to detect at least one characteristic in the image data, where the at least one characteristic may be present in varying levels indicative of a brightness of a village,
   wherein said controller is further configured to select a mode of operation from at least the following modes of operation: a dark village mode, a bright village mode, and at least one non-village mode,
   wherein said controller selects a dark village mode if the at least one characteristic reaches a first threshold,
   wherein said controller selects a bright village mode if the at least one characteristic reaches a second threshold, where the second threshold is set to a higher level of the at least one characteristic so as to represent a brighter village than a dark village as represented by the first threshold, and wherein said controller selects one of said at least one non-village mode if said controller is not operating in either the dark village mode or the bright village mode.

2. The system of claim 1, wherein the characteristic includes an average ambient light level of at least a portion of the external scene, wherein said controller selects a dark village mode if the average ambient light level of at least a portion of the external scene reaches a first ambient threshold level, and wherein said controller selects a bright village mode if the average ambient light level of at least a portion of the external scene reaches a second ambient threshold level.

3. The system of claim 2, wherein the average ambient light level of at least a portion of the external scene is measured from an upper portion of the external scene.

4. The system of claim 1, wherein the characteristic includes a number of light level peaks detected in an upper portion of the external scene, wherein said controller selects a dark village mode if the number of light level peaks detected in the upper portion of the external scene reaches a first peak threshold, and wherein said controller selects a bright village mode if the number of light level peaks detected in the upper portion of the external scene reaches a second peak threshold.

5. The system of claim 4, wherein the number of light level peaks detected in the upper portion of the external scene is comprised of a number of street lights detected in the image data corresponding to the external scene.

6. The system of claim 1, wherein the characteristic includes a number/density of AC powered light sources in at least a portion of the external scene, wherein said controller selects a dark village mode if the number/density of AC powered light sources in at least a portion of the external scene reaches a first AC powered light source threshold, and wherein said controller selects a bright village mode if the number/density of AC powered light sources in at least a portion of the external scene reaches a second AC powered light source threshold.

7. The system of claim 1, wherein if one of the at least one non-village modes is selected, said controller continues to receive and analyze image data in order to determine whether to select the bright village mode or the dark village mode or continue in at least one non-village mode.

8. The system of claim 1, wherein if the bright village mode or the dark village mode is selected, continuing to receive and analyze image data in order to determine whether to select the non-village mode if a measured characteristic of the image data falls below a predetermined threshold parameter.

9. A method for controlling equipment of a controlled vehicle, comprising:

imaging a scene external and forward of the controlled vehicle and generating image data corresponding to the acquired images;

receiving and analyzing the image data in a controller to detect at least one characteristic of the image data, where the at least one characteristic may be present in varying levels indicative of a brightness of a village;

generating a control signal that is used to control the equipment in response to analysis of the image data and in response to a selected mode of operation, selecting a mode of operation from at least the following modes of operation: a dark village mode; a bright village mode; and at least one non-village mode, selecting a dark village mode if the characteristic reaches a first threshold, selecting a bright village mode if the characteristic reaches a second threshold, where the second threshold is set to a higher level of the at least one characteristic so as to represent a brighter village than a dark village as represented by the first threshold, and selecting one of said at least one non-village modes if said controller is not operating in either the dark village mode or the bright village mode.

10. The method of claim 9, wherein the characteristic includes an average ambient light level of at least a portion of the external scene, wherein the controller selects a dark village mode if the average ambient light level of at least a portion of the external scene reaches a first ambient threshold level, and wherein the controller selects a bright village mode if the average ambient light level of at least a portion of the external scene reaches a second ambient threshold level.

11. The method of claim 10, wherein the average ambient light level of at least a portion of the external scene is measured from an upper portion of the external scene.

12. The method of claim 9, wherein the characteristic includes a number of light level peaks detected in an upper portion of the external scene, wherein the controller selects a dark village mode if the number of light level peaks detected in the upper portion of the external scene reaches a first peak threshold, and wherein the controller selects a bright village mode if the number of light level peaks detected in the upper portion of the external scene reaches a second peak threshold.

13. The method of claim 12, wherein the number of light level peaks detected in the upper portion of the external scene is comprised of a number of street lights detected in the image data corresponding to the external scene.

14. The method of claim 9, wherein the characteristic includes a number/density of AC powered light sources in at least a portion of the external scene, wherein the controller selects a dark village mode if the number/density of AC powered light sources in at least a portion of the external scene reaches a first AC powered light source threshold, and wherein the controller selects a bright village mode if the number/density of AC powered light sources in at least a portion of the external scene reaches a second AC powered light source threshold.

15. The method of claim 9, wherein if one of the at least one non-village modes is selected, the controller continues to receive and analyze image data in order to determine whether to select the bright village mode or the dark village mode or continue in the at least one non-village mode.

16. The method of claim 9, wherein if the bright village mode or the dark village mode is selected, continuing to receive and analyze image data in order to determine whether to select the non-village mode if a measured characteristic of the image data falls below a predetermined threshold parameter.

17. A non-transitory computer readable medium having stored thereon software instructions that, when executed by a processor, cause the processor to control equipment of a controlled vehicle, by executing the steps comprising:

imaging a scene external and forward of the controlled vehicle and generating image data corresponding to the acquired images;

receiving and analyzing the image data to detect at least one characteristic of the image data, where the at least one characteristic may be present in varying levels indicative of a brightness of a village;

generating a control signal that is used to control the equipment in response to analysis of the image data and in response to a selected mode of operation, selecting a mode of operation from at least the following modes of operation: a dark village mode; a bright village mode; and at least one non-village mode, selecting a dark village mode if the characteristic reaches a first threshold, selecting a bright village mode if the characteristic reaches a second threshold, where the second threshold is set to a higher level of the at least one characteristic so as to represent a brighter village than a dark village as represented by the first threshold, and selecting one of said at least one non-village mode if either the dark village mode or the bright village mode is not selected.

18. The non-transitory computer readable medium of claim 17, wherein the at least one characteristic includes an average ambient light level of at least a portion of the external scene, wherein a dark village mode is selected if the average ambient light level of at least a portion of the external scene reaches a first ambient threshold level, and wherein a bright village mode is selected if the average ambient light level of at least a portion of the external scene reaches a second ambient threshold level.

19. The non-transitory computer readable medium of claim 18, wherein said average ambient light level of at least a portion of the external scene is measured from an upper portion of the external scene.

20. The non-transitory computer readable medium of claim 17, wherein the at least one characteristic includes a number of light level peaks detected in an upper portion of the external scene, wherein a dark village mode is selected if the number of light level peaks detected in the upper portion of the external scene reaches a first peak threshold, and wherein a bright village mode is selected if the number of light level peaks detected in the upper portion of the external scene reaches a second peak threshold.

21. The non-transitory computer readable medium of claim 17, wherein the at least one characteristic includes a number/density of AC powered light sources in at least a portion of the external scene, wherein a dark village mode is selected if the number/density of AC powered light sources in at least a portion of the external scene reaches a first AC powered light source threshold, and wherein a bright village mode is selected if the number/density of AC powered light sources in at least a portion of the external scene reaches a second AC powered light source threshold.

22. The non-transitory computer readable medium of claim 17, wherein if one of the at least one non-village modes is selected, continuing to receive and analyze image data to determine whether to select the bright village mode or the dark village mode or continue in said at least one non-village mode.

23. The non-transitory computer readable medium of claim 17, wherein if the bright village mode or dark village mode is selected, continuing to receive and analyze image data in order to determine whether to select the non-village mode if a measured characteristic of the image data falls below a predetermined threshold parameter.

24. An exterior light control for controlling exterior lights of a controlled vehicle, comprising:

an imaging system configured to image a scene external and forward of the controlled vehicle and to generate image data corresponding to the acquired images; and a controller configured to receive and analyze the image data and for generating an exterior light control signal that is used to control the exterior lights in response to analysis of the image data and in response to a selected mode of operation, such that said controller responds to analysis of image data differently when in different modes of operation, wherein said controller is further configured to analyze the image data to detect at least one of: an average ambient light level of at least a portion of the external scene; a number of light level peaks detected in an upper portion of the external scene; and a number/density of AC powered light sources in at least a portion of the external scene, wherein said controller is further configured to select a mode of operation from at least the following modes of operation: a dark village mode; a bright village mode; and at least one non-village mode, wherein said controller is further configured to select a dark village mode if at least one of the following conditions is met: the average ambient light level of at least a portion of the external scene reaches a first ambient threshold level; the number of light level peaks detected in the upper portion of the external scene reaches a first peak threshold; and the number/density of AC powered light sources in at least a portion of the external scene reaches a first AC powered light source threshold, wherein said controller is further configured to select a bright village mode if at least one of the following conditions is met: the average ambient light level of at least a portion of the external scene reaches a second ambient threshold level; the number of light level peaks detected in the upper portion of the external scene reaches a second peak threshold; and the number/density of AC powered light sources in at least a portion of the external scene reaches a second AC powered light source threshold, and wherein said controller is further configured to select one of said at least one non-village modes if said controller is not operating in either the dark village mode or the bright village mode, wherein the exterior lights are in a first state when said controller selects a dark village mode and are in a second state when said controller selects a bright village mode.

25. The exterior light control of claim 24, wherein if one of said at least one non-village modes is selected, said controller is configured to continue to receive and analyze image data in order to determine whether to select the bright village mode or the dark village mode or continue in the at least one non-village mode.

26. The exterior light control of claim 24, wherein the average ambient light level of at least a portion of the external scene is measured from an upper portion of the external scene.

27. The exterior light control of claim 24, wherein if the bright village mode or dark village mode is selected, said controller is configured to continue to receive and analyze image data in order to determine whether to select the non-village mode if a measured characteristic of the image data falls below a predetermined threshold parameter.

28. The exterior light control of claim 24, wherein said controller is further configured to automatically disable high-beam activation of the exterior lights when the bright village mode is selected.

\* \* \* \* \*